United States Patent [19]

Hedberg

[11] Patent Number: 5,994,921
[45] Date of Patent: Nov. 30, 1999

[54] UNIVERSAL SENDER DEVICE

[75] Inventor: Mats Hedberg, Haninge, Sweden

[73] Assignee: Telefonaktiebolaget LM Ericsson, Stockholm, Sweden

[21] Appl. No.: 09/015,549

[22] Filed: Jan. 29, 1998

Related U.S. Application Data

[63] Continuation of application No. PCT/SE96/00965, Jul. 24, 1996.

[30] Foreign Application Priority Data

Jul. 27, 1995 [SE] Sweden .................. 9502715

[51] Int. Cl.⁶ ............... H03K 19/0175; H03K 19/094
[52] U.S. Cl. .................. 326/81; 326/80; 326/83; 326/87
[58] Field of Search ................ 326/80, 81, 83, 326/87, 86

[56] References Cited

U.S. PATENT DOCUMENTS

| | | | |
|---|---|---|---|
| 4,408,135 | 10/1983 | Yuyama et al. | 326/87 |
| 4,527,081 | 7/1985 | Stewart | 326/87 |
| 4,604,731 | 8/1986 | Konishi | 326/87 |
| 5,095,230 | 3/1992 | Takai et al. | 326/87 |
| 5,111,080 | 5/1992 | Mizukami et al. | |
| 5,179,293 | 1/1993 | Hilton . | |
| 5,263,049 | 11/1993 | Winen et al. | |
| 5,319,259 | 6/1994 | Merrill . | |
| 5,625,648 | 4/1997 | Hedberg . | |
| 5,644,255 | 7/1997 | Taylor | 326/81 |

FOREIGN PATENT DOCUMENTS

| | | |
|---|---|---|
| WO95/26078 | 3/1995 | WIPO . |
| WO95/15616 | 6/1995 | WIPO . |

*Primary Examiner*—Michael Tokar
*Assistant Examiner*—Richard Roseen
*Attorney, Agent, or Firm*—Burns, Doane, Swecker & Mathis, L.L.P.

[57] ABSTRACT

A sender device capable of sending digital information in the form of electrical binary signals to a receiver device. N-MOS transistors and P-MOS transistors are arranged in pairs. Each pair comprises an N-MOS transistor and a P-MOS transistor. The N-channel of an N-MOS transistor located in one pair, and the P-channel of a P-MOS transistor located in the same pair are connected in parallel, whereby a broad signalling voltage range is accomplished.

39 Claims, 3 Drawing Sheets

5,994,921

1

UNIVERSAL SENDER DEVICE

This application is a continuation of International Application Ser. No. PCT/SE96/00965, filed Jul. 24, 1996, which designates the United States.

BACKGROUND

The invention relates to a sender device for sending digital information in the form of electrical binary signals to a receiver device. Said sender device comprises N-MOS transistors and P-MOS transistors. Each N-MOS transistor has an N-channel, and each P-MOS transistor has a P-channel.

Advances in electronic technology and design, and a strive towards boosted performance in terms of power consumption and speed, among many other things, has led to a variety of concepts for electrical binary signalling between circuits and circuit boards. Early concepts are DTL (Diode-Transistor Logic), TTL (Transistor-Transistor Logic) and ECL (Emitter Coupled Logic). These employ so called single-ended signalling. More recent concepts often employ a technique called differential signalling, also known as balanced signalling, which uses two signalling wires. Such concepts are DPECL (Differential Pseudo Emitter Coupled Logic), LVDS (Low Voltage Differential Signalling) and GLVDS (Grounded Low Voltage Differential Signalling). GLVDS is disclosed in the Swedish patent applications SE 9304025-1 and SE 9400971-9.

Although the above mentioned differential signalling concepts are indeed differential, each of the two signalling wires operate at fixed nominal voltages, which are related to ground. Each wire operates at two voltage levels, referred to as low voltage level and high voltage level, respectively.

DPECL typically has a signalling low voltage level of 3.4 V, and a high level of 3.9 V. LVDS on the other hand has a low level of 0.95 V, and a high level of 1.45 V, while GLVDS has a low level of 0 V and a high level of 0.5 V. The voltages are related to ground.

A sender device and a receiver device of a signalling concept of the above said types sends and receives, respectively, signals within a quite narrow voltage interval. In particular, a sender device and a receiver device for signalling at voltage potentials close to ground level, such as in GLVDS, typically operate only for low signalling voltage levels, e.g. less than 1 V. Such a sender device is not compatible with a receiver device of a different signalling concept that requires other signalling voltage levels.

A problem is to arrange electronic circuitry for a universal sender device which operates within a broad range of signalling voltage levels.

In U.S. Pat. No. 5,179,293 is disclosed a technique and circuit for switching a bipolar output stage between an active mode and an inhibit mode. In the inhibit mode, the output stage is deactivated, and the output node of the stage represents a high impedance.

In U.S. Pat. No. 5,319,259 is disclosed an output stage suitable for use with a variety of supply voltages, including supply voltages less than 5 volts. The output stage allows proper operation when a legitimate over voltage is applied to its output pad.

In U.S. Pat. No. 5,111,080 is disclosed a signal transmission circuit in which a signal is converted into two complementary signals which are output from a signal transmission circuit via series resistors. The amplitude of each of the complementary signals is reduced by the series resistors and terminating resistors provided on a signal receiving side. The signal receiving side shifts the level of its received input. The level shifted signals are amplified by a high-input impedance differential amplifying circuit.

SUMMARY

An object of the present invention is to solve the aforementioned problem of arranging electronic circuitry for a universal sender device which operates within a broad range of signalling voltage levels.

This object is accomplished by the sender device comprising pairs of transistors. Each pair comprises in turn an N-MOS transistor and a P-MOS transistor. The N-channel of the N-MOS transistor of a pair is connected in parallel with the P-channel of the P-MOS transistor of the same pair. The N-MOS transistor is active in a first mode of operation, and the P-MOS transistor is active in a second mode of operation. The gate terminal of the N-MOS transistor of the pair and the gate terminal of the P-MOS transistor of the same pair are controlled by signals having complementary values.

A sender device according to the invention is compatible with receiver devices of several existing signalling concepts, e.g. DPECL, LVDS and GLVDS. The sender device according to the invention is also believed to be compatible with future signalling concepts. Signalling voltages of the sender device range from slightly negative, e.g. –0.5 V, up to in the order of several volts, e.g. 5 V.

BRIEF DESCRIPTION OF DRAWINGS

The invention, together with further objects and advantages thereof, will become clear from the following description by making reference to the accompanying drawings, in which.

DETAILED DESCRIPTION

Figure 1:
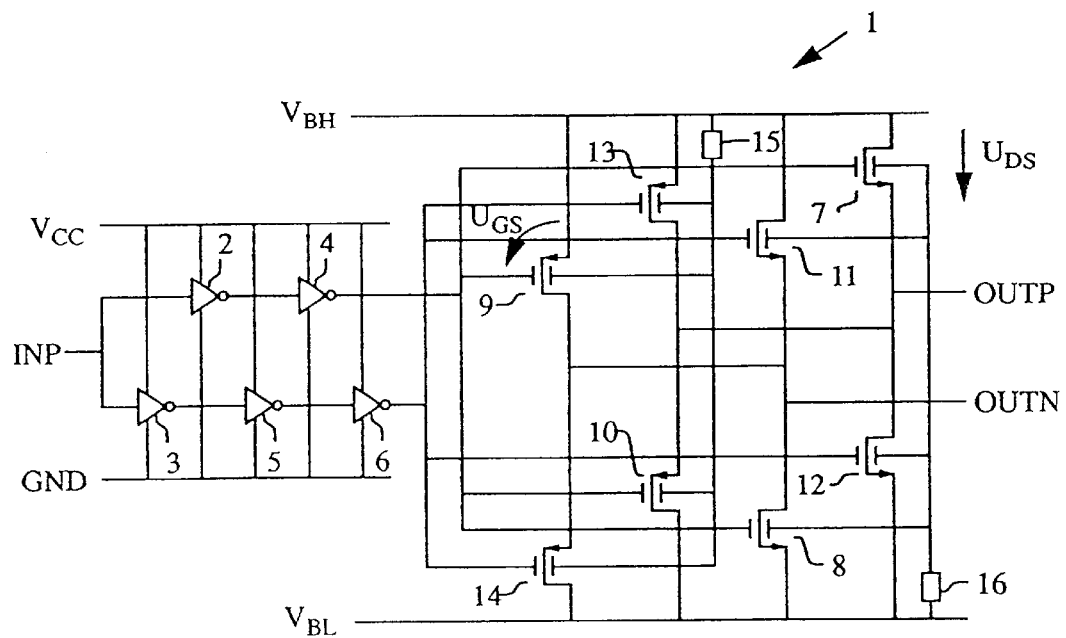
FIG. 1 is a circuit diagram of a signal sender device according to the invention.

FIG. 1 shows a sender device 1 according to the invention. An input INP of the sender device 1 is connected to the inputs of inverters 2, 3. The outputs of the inverters 2, 3 are in turn connected to the inputs of inverters 4, 5. The output of the inverter 5 is connected to the input of an inverter 6. The negative supply terminals of the inverters 2–6 are connected to ground GND, while the positive supply terminals are connected to a supply voltage VCC. The output of the inverter 4 is connected to the gates of N-MOS transistors 7, 8 and to the gates of P-MOS transistors 9, 10. The output of the inverter 6 is connected to the gates of N-MOS transistors 11, 12 and to the gates of P-MOS transistors 13, 14. The drain terminals of the N-MOS transistors 7, 11 and the source terminals of the P-MOS transistors 9, 13 are connected to a supply voltage VBH. The source terminals of the N-MOS transistors 8, 12 and the drain terminals of the P-MOS transistors 10, 14 are connected to a supply voltage VBL. The source terminals of the transistors 7, 10 and the drain terminals of the transistors 12, 13 are connected to an output terminal OUTP of the sender device 1. The drain terminals of the transistors 8, 9 and the source terminals of the transistors 11, 14 are connected to a second output terminal OUTN of the sender device 1.

The bulk terminals of the P-MOS transistors 9, 10, 13, 14 are connected to the supply voltage VBH, via a resistor 15. The bulk terminals of N-MOS transistors 7, 8, 11, 12 are connected to the supply voltage VBL, via a resistor 16.

The N-channels of the N-MOS transistors 7, 8, 11, 12 are hence connected in parallel with the P-channels of corresponding P-MOS transistors 9, 10, 13, 14.

The sender device receives a binary signal at its input INP from logic circuitry, not shown, which binary signal is converted, in a series of inverters 2–6, to a first and a second signal having complementary values. There is hence a low voltage at the output of one of the inverters 4, 6, while at the output of the other inverter 4 or 6 there is a high voltage at the same time. The low voltage is close to ground GND, and the high voltage is close to VCC. The inverters 2–5, which may at first seem superfluous, serve the purpose of bringing the two signals that are connected to the gates of the transistors 7–14 in phase with one another. This is accomplished by slowing down the response of the inverter 2, e.g. by a capacitive load, not shown, connected to the output of the inverter 2. The inverter 4 restores the shape of the signal from the output of the inverter 2.

The sender device is capable of producing at its outputs OUTP, OUTN, voltages ranging from slightly negative, approximately –0.5 V, up to voltages in the order of 5 V for a VCC of 3.3 V, given as an example. The voltage swing, being the voltage difference VOUTP–VOUTN between the outputs OUTP, OUTN of the sender device, is typically +/–0.5 V unloaded, but may depart from this value. The voltages at the outputs OUTP, OUTN are set by appropriately choosing the supply voltages VBH, VBL, which will be further described.

Due to the inherent on-resistance RDSon of MOS transistors, the output voltages of a loaded sender device may not be the same as the supply voltages VBH, VBL. A load, typically a signal receiver and a termination network, connected to the sender device draws current through the transistors, which causes a voltage drop across the transistors. This voltage drop is compensated for when choosing the supply voltages VBH, VBL in order to achieve predetermined output voltages.

By choosing for example $V_{BH}$=3.9 V and $V_{BL}$=3.4 V, the output voltages $V_{OUTP}$ and $V_{OUTN}$ will be compatible with signalling voltages of a DPECL receiver, provided a termination network, not shown, is properly arranged. At $V_{BH}$= 1.45 V and $V_{BL}$=0.95 V, the outputs OUTP, OUTN are compatible with an LVDS receiver. At $V_{BH}$=0.5 V and $V_{BL}$=0 V, the outputs OUTP, OUTN are compatible with a GLVDS receiver.

The sender device will be further explained by describing two modes of operation. In a first mode to be described, supply voltages $V_{BH}$ and $V_{BL}$ are in the lower region of the operating range. As an example, $V_{BH}$ is 0.5 V and $V_{BL}$ is 0 V. In a second mode to be described, $V_{BH}$ and $V_{BL}$ are in the order of several volts. As an example, $V_{BH}$ is 3.9 V and $V_{BL}$ is 3.4 V. In both modes of operation, the input INP can be either at a high level, close to VCC, or at a low level, close to ground GND.

In the first mode of operation, the P-MOS transistors 9, 10, 13, 14 are in a non-conducting state. In this mode, the voltage drops $U_{GS}$ across the P-MOS transistors 9, 10, 13, 14 are not sufficiently large to turn the P-MOS transistors 9, 10, 13, 14 into a conducting state. $U_{GS}$ is illustrated for the transistor 9 only. When the input INP is at a high level, the output of the inverter 4 is at a high level, approximately 3.3 V, and the output of the inverter 6 is at a low level, approximately 0 V. N-MOS transistors 11, 12 will then also be in a non-conducting state while N-MOS transistors 7, 8 are in a conducting state, since the voltage drops $U_{GS}$ of the N-MOS transistors 7, 8 are well above a threshold value of e.g. 0.7 V. As a consequence thereof, the output OUTP is at a high voltage, determined by the on-state voltage drop $U_{DS}$ across the transistor 7, and the output OUTN is at a low voltage, determined by the on-state voltage drop $U_{DS}$ across the transistor 8. UDS is illustrated for the transistor 7 only. When the input INP is at a low level, the output levels of the inverters 4, 6 are interchanged, i.e. the output of the inverter 4 is at a low level, and the output of the inverter 6 is at a high level. Only transistors 11, 12 will be conducting, causing a low voltage on the output OUTP, and a high voltage on the output OUTN. Neglecting the on-state voltage drop of the transistors, which is caused by an on-state resistance $R_{DSon}$ and current ID drawn through the transistors, the aforementioned high voltage is equal to $V_{BH}$, i.e. 0.5 V, and the low voltage is equal to $V_{BL}$, i.e. 0 V.

In the second mode of operation, the N-MOS transistors 7, 8, 11, 12 are in a non-conducting state. When the input INP is at a high level, the transistors 9, 10 are non-conducting, and the transistors 13, 14 are conducting. The voltage of the output OUTP is 3.9 V, and the voltage of the output OUTN is 3.4 V, provided the on-state voltage drop across the transistors is neglected. When the input INP is at a low level, the voltages at the outputs OUTP, OUTN of the sender device are interchanged.

Hence, in the first mode of operation, only a first set of transistors, the N-MOS transistors 7, 8, 11, 12, are active, and in the second mode of operation, only a second set of transistors, the P-MOS transistors 9, 10, 13, 14, are active.

Figure 2:
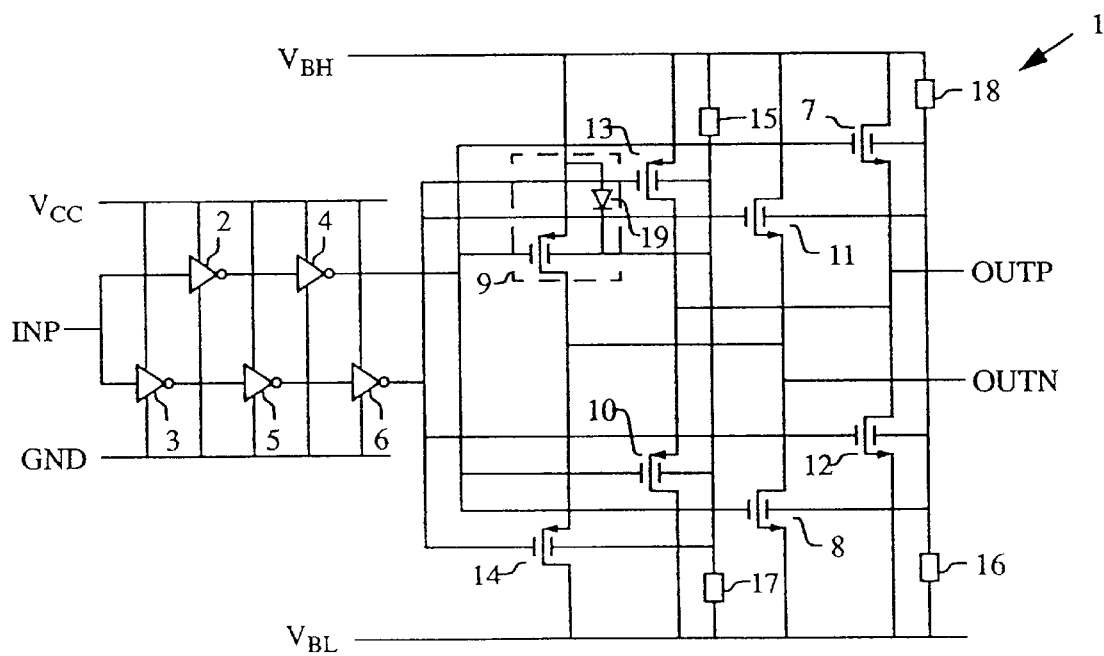
FIG. 2 is a circuit diagram of a signal sender device according to the invention, where bulk terminals are connected to a voltage dividing network.

At VBL around 1 V, and $V_{BH}$ around $V_{BL}$+0.5 V, there is a crossover region between the two modes of operation in which both sets of transistors are partially active. By careful design, the sender device 1 operates almost seamlessly between the two modes of operation previously described. This is accomplished e.g. by connecting, via resistors 15, 16, the bulk terminals of the P-MOS transistors 9, 10, 13, 14 to $V_{BH}$, and the bulk terminals of the N-MOS transistors 7, 8, 11, 12, provided they are available, to $V_{BL}$. By connecting the bulk terminals of the transistors to a voltage dividing network of resistors 15, 16, 17, 18, shown in FIG. 2, rather than directly to $V_{BH}$ and $V_{BL}$, the threshold voltages $U_{Gsth}$ are changed, thereby extending or moving the operating range of each mode. The overlap between the modes is thereby controllable during design. Another approach, not shown, is to connect the bulk terminals to programmable voltage references, whereby the overlap is dynamically controllable by changing the voltages of the voltage references.

Normal practice for one skilled in the art would be to connect the bulk terminals of the P-MOS transistors 9, 10, 13, 14 to $V_{CC}$. This would exclude an operating voltage $V_{BH}$ exceeding $V_{CC}$+a diode forward voltage drop of approximately 0.7 V, because of parasitic diodes present in the P-MOS transistors 9, 10, 13, 14. A parasitic diode 19 of the transistor 9 is shown as an example in FIG. 2. According to an object of the invention, the operating voltage $V_{BH}$ can be chosen considerably higher than $V_{CC}$+0.7 V, e.g. $V_{CC}$+1.7 V, because of the bulk terminal arrangement of the invention.

Figure 3:
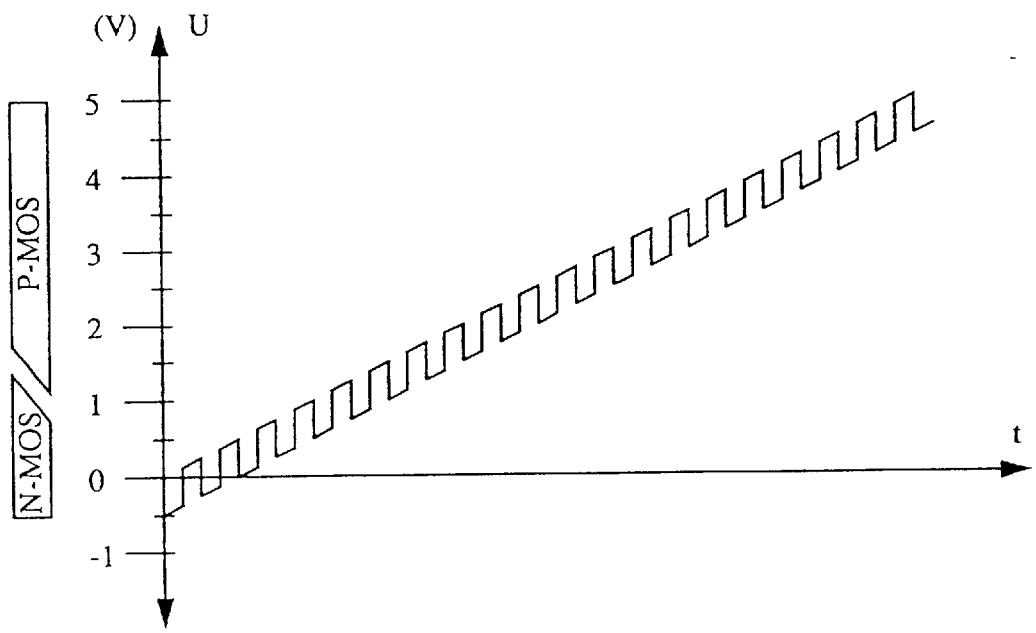
FIG. 3 shows, in a diagram, modes of operation at different signalling voltages.

FIG. 3 shows the output voltage $U_{OUTP}$ of the sender device as a function of time. Also shown are the two partially overlapping modes of operation, labeled N-MOS and P-MOS respectively. The supply voltage $V_{BL}$ is being swept from −0.5 V to 4.5 V and the supply voltage $V_{BH}$ is being swept from 0 V to 5 V. During the sweeping time t, the input INP is frequently toggled. As can be seen in the diagram, the output voltage $U_{OUTP}$ ranges uninterruptedly from −0.5 V to 5 V. During the sweeping time, the sender device transitions from the first mode of operation into the second mode of operation.

Figure 4:
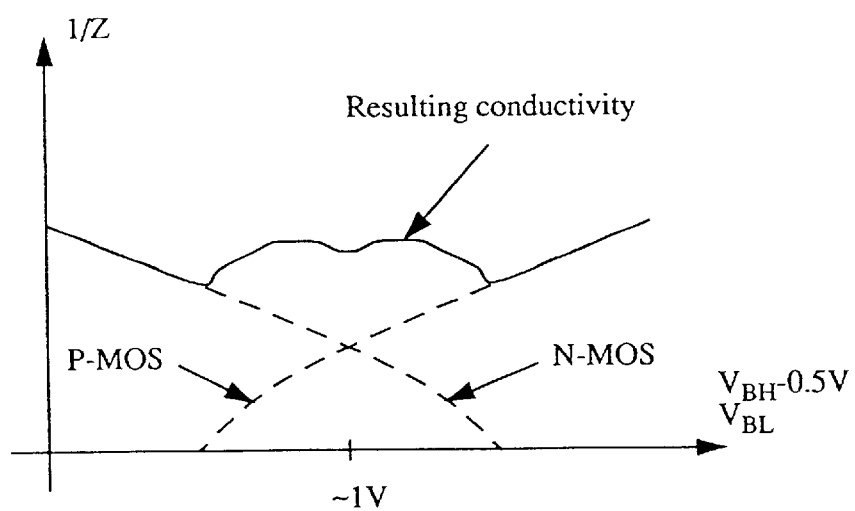
FIG. 4 shows, in a diagram, the conductivity of an N-MOS transistor and of a P-MOS transistor at different voltages in a sender device according to the invention.

FIG. 4 shows conductivity 1/Z as a function of supply voltages $V_{BL}$, $V_{BH}$. The conductivity of an N-MOS transistor, e.g. N-MOS transistor 7, and the conductivity of a corresponding P-MOS transistor, e.g. transistor 13, are shown, as well as the resulting conductivity 1/Z, related to ground GND, at the output OUTP of the sender device 1. The resulting conductivity is the sum of the conductivity of transistors which are simultaneously conducting. The transistors are biased, by appropriately setting the voltages at the bulk terminals, such that the resulting conductivity is approximately constant throughout the operating range of the sender device.

Wires which are used for conveying signals from the sender device to a receiver device at high signalling speeds are designed as transmission lines. The termination impedance of a transmission line ideally matches the characteristic impedance of the transmission line. The impedance of the sender device 1 is designed to roughly match the characteristic impedance of the transmission lines interconnecting the signal sender device and the signal receiver device, without using dedicated resistive elements for termination, such as resistors or MOS transistors. This is accomplished by selecting transistors having appropriate impedance values $R_{DSon}$.

Figure 5:
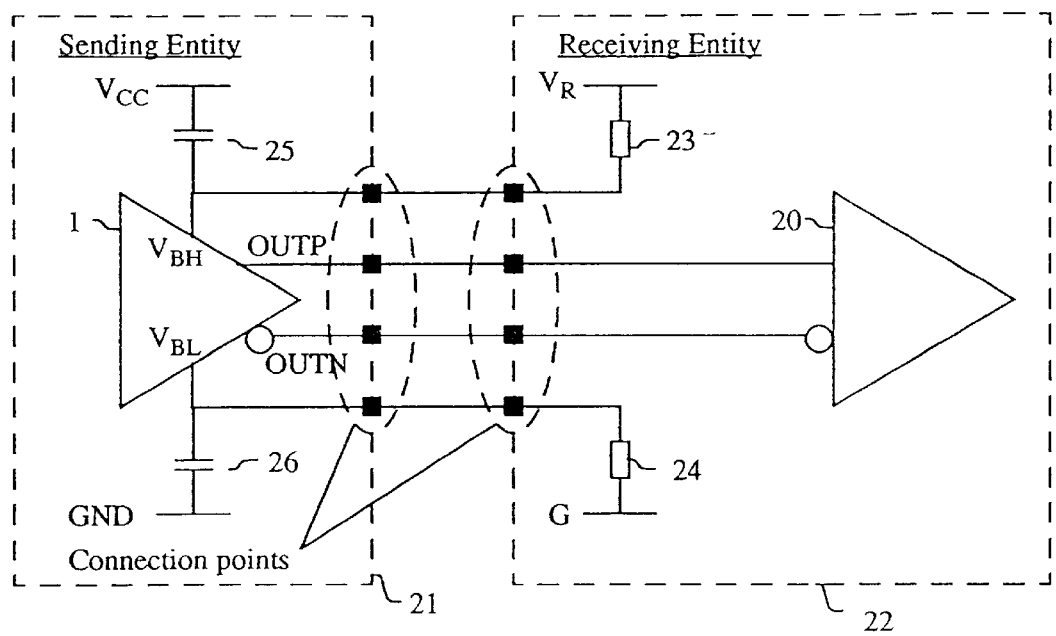
FIG. 5 shows a sender entity comprising a sender device according to the invention, which signal sender device receives its supply voltages from a receiver entity.

In FIG. 5 is shown a signal sender device 1 according to the invention, connected to a receiver device 20. The sender device 1 and the receiver device 20 are located on different entities 21, 22, e.g. two circuit boards. The supply voltages $V_{BH}$ and $V_{BL}$ are supplied by the receiver entity 22. The signalling voltages $V_{OUTN}$, $V_{OUTH}$ are hence determined by the receiver entity 22, and set to fit the receiver device 1 signalling voltages. A simple means to achieve appropriate supply voltages $V_{BH}$, $V_{BL}$ for the sender device 1 is by using a voltage dividing network 23, 24, connected to the receiver entity 22 supply voltage $V_R$ and ground G, respectively. Capacitors 25, 26 are provided for decoupling the supply voltages $V_{BH}$, $V_{BL}$.

Figure 6:
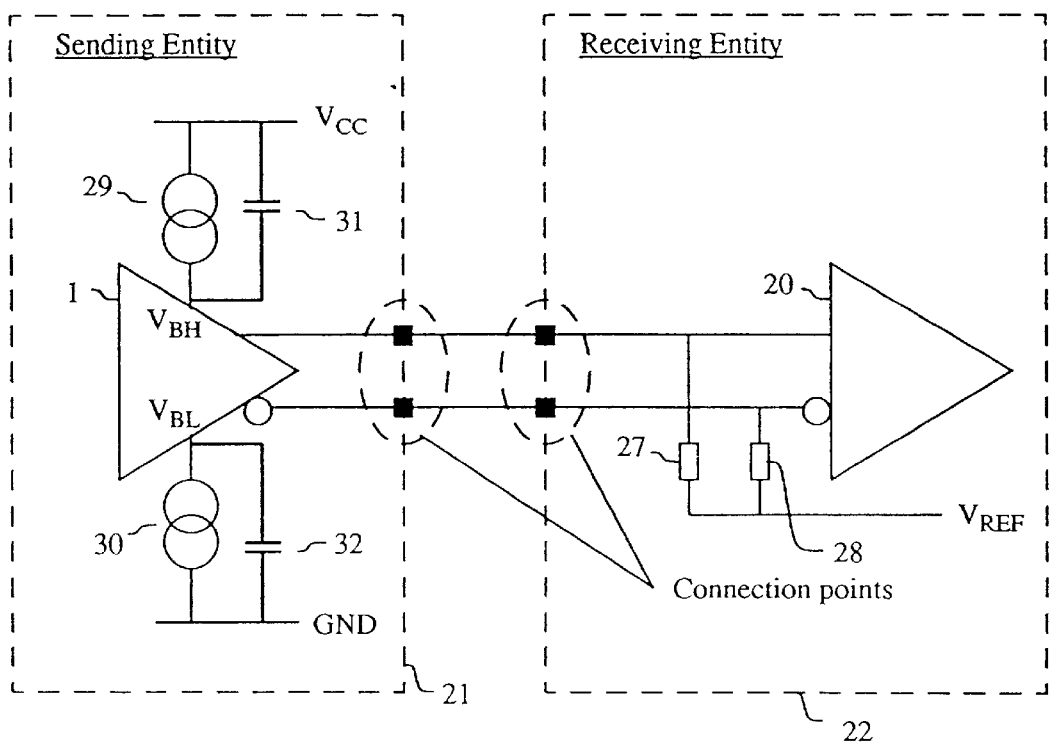
FIG. 6 shows a sender entity comprising a signal sender device according to the invention, which signal sender device receives its supply voltages from the sender entity, said supply voltages being determined by a receiver entity.

In FIG. 6 is shown a different approach for achieving appropriate supply voltages $V_{BH}$, $V_{BL}$, determined by the receiver entity 22, for the sender device 1. The receiver entity 22 termination network 27, 28 is connected to a fix voltage reference $V_{REF}$, the voltage reference $V_{REF}$ being within the receiver device 20 signalling-voltage range. A power supply which supplies the sender device 1 is located at the sender entity 21. It comprises two current generators 29, 30. Such a power supply, known per se, provides floating voltages, i.e. supply voltages $V_{BH}$ and $V_{BL}$ not related to a fix voltage reference. Accordingly, the outputs OUTP, OUTN are also floating (refer to FIG. 3). Capacitors 31, 32 are provided for decoupling the supply voltages $V_{BH}$, $V_{BL}$.

The signalling levels are hence enforced by the termination-network voltage-reference $V_{REF}$.

The advantage of dictating the signalling levels from the receiver entity 22 is that no modification will have to be carried out on an existing sender entity 21 when replacing one receiver entity 22 by another receiver entity 22 of a newer design accommodating a different receiver device 20, which uses different signalling levels.

Various alterations and modifications can be done in the described embodiments of the invention by one having skills in the art, without departing from the scope and the spirit of the invention. For example, voltage values stated in the embodiments are only intended as examples for demonstrating the principles of the invention. Other voltage values may be used without changing the essentials of the invention. Major principles of the invention apply also to single-ended sender devices. Single-ended signalling is well known in the art.

What is claimed is:

1. A sender device for sending digital information in the form of electrical binary signals to receiver device, said sender device comprising N-MOS transistors, each of which has an N-channel, and P-MOS transistors, each of which has a P-channel, wherein said sender device comprises pairs of transistors, each one of said pair of transistors in turn comprising one of said N-MOS transistors and one of said P-MOS transistors, said N-channel of an N-MOS transistor comprised in a pair is connected in parallel with said P-channel of a P-MOS transistor comprised in the same pair, and bulk terminals are connected to supply voltages via resistor networks.

2. A sender device according to claim 1, wherein said supply voltages are provided by an entity where said receiver device is located.

3. A sender device according to claim 1, wherein said supply voltages are floating with respect to ground.

4. A sender device according to claim 3, wherein signalling voltages are controlled from an entity where said receiver device is located, by setting a reference voltage to which a termination network is connected.

5. A sender device for sending digital information in the form of electrical binary signals via a transmission line to a receiver device, comprising:

an input terminal for receiving data signals to be sent;

an output stage having an output adapted for connection with a transmission line, and having power supply terminals for receiving an operating voltage for the output stage;

power supply means connected with said output stage power supply terminals, for supplying said operating voltage to said output stage;

wherein said power supply means is adapted to supply said operating voltage floating with respect to ground (GND).

6. A sender device according to claim 5, wherein said power supply means comprises a series connection of a first current source and a second current source;

said first current source being connected to a first of said output stage power supply terminals and said second current source being connected to a second (Vbl) of said power supply terminals.

7. A sender device adapted for connection to a receiver entity via a transmission line, for sending digital information in the form of electrical binary signals via said transmission line to said receiver entity, comprising:

an input terminal for receiving data signals to be sent;

an output stage having an output adapted for connection with a transmission line, and having power supply terminals for receiving an operating voltage for the output stage, wherein said output stage is adapted to have said operating voltage supplied by said receiver entity and pairs of transistors, each one of said pair of transistors in turn comprising one N-MOS transistor and one P-MOS transistor, said N-channel of an N-MOS transistor comprised in a pair being connected in parallel with said P-channel of a P-MOS transistor comprised in the same pair.

8. A sender device according to claim 7, wherein said N-MOS transistor is active in a first mode of operation, and said P-MOS transistor is active in a second mode of operation.

9. A sender device according to claim 8, wherein a gate terminal of said N-MOS transistor comprised in said pair, and a gate terminal of said P-MOS transistor comprised in the same pair are controlled by signals having complementary values.

10. A sender device according to claim 8, wherein bulk terminals of said P-MOS transistors are connected to a positive supply voltage.

11. A sender device according to claim 7 to wherein bulk terminals of said N-MOS transistors are connected to a negative supply voltage.

12. A sender device according to claim 7 wherein bulk terminals are connected to supply voltages via resistor networks.

13. A sender device according to claim 7 wherein an output impedance of said sender device is matched to a characteristic impedance of a transmission line connected to the output of said sender device, by making use of the inherent impedance of said N-MOS transistors in said first mode of operation and by making use of the inherent impedance of said P-MOS transistors in said second mode of operation.

14. A sender device according to claim 12 wherein said supply voltages are provided by an entity (22) where said receiver device is located.

15. A sender device according to claim 12 wherein said supply voltages are floating with respect to ground.

16. A sender device according to claim 15, wherein signalling voltages are controlled from an entity where said receiver device is located, by setting a reference voltage to which a terminal network is connected.

17. A sender device connected to a receiver device for sending digital information in the form of electrical binary signals via a transmission line, the sender device and the receiver device being located on different entities the sender device comprising:

an input terminal for receiving data signals to be sent;

an output stage having an output adapted for connection with a transmission line, and having power supply terminals for receiving an operating voltage for the output stage; and power supply means being located on the receiver entity and connected with said output stage power supply terminals, for supplying said operating voltage to said output stage to fit the receiver device signalling voltages, wherein said power supply means is a voltage dividing network connected to a receiver entity supply voltage and Ground, respectively.

18. A sender device responsive to an electrical binary input signal at an input for sending, at an output, an electrical binary output signal to a receiver device, said sender device comprising:

a first output stage operating in a first operating range of signaling voltage levels; and a second output stage operating in a second operating range of signaling voltage levels, said second operating range being at least partly different from said first operating range, a first output of said first output stage and a second output of said second output stage being interconnected and forming the output of the sender device, for accomplishing an aggregated operating range extending further than either one of said first operating range and said second operating range, separately, and said first and second output stages being driven by variable supply voltages determining the output signaling voltage levels of the sender device within said aggregated operating range.

19. A sender device according to claim 18, wherein said first output stage is active for signaling voltages in the lower region of said aggregated range, and said second output stage is active for signaling voltages in the upper region of said aggregated range.

20. A sender device according to claim 18, wherein said first output stage is inactive for signaling voltages in the upper region of said aggregated range, and said second output stage is inactive for signaling voltages in the lower region of said aggregated range.

21. A sender device according to claim 18, wherein said supply voltages are selected such that output signaling voltage levels of the sender device are compatible with the signaling voltage levels of the receiver device.

22. A sender device according to claim 18, wherein said supply voltages are supplied by a receiving entity that includes the receiver device, said supply voltages being adapted to fit the signaling voltage levels of the receiver device.

23. A sender device according to claim 18, wherein said supply voltages are controlled from an entity that includes the receiver device, by setting a reference voltage to which a termination network is connected.

24. A sender device according to claim 18, wherein said supply voltages are floating with respect to ground.

25. A sender device according to claim 18, wherein said first output stage has a first transistor and a second transistor, and said second output stage has a third and a fourth transistor, said first transistor and said second transistor being N-MOS transistors each having an N-channel, and said third transistor and said fourth transistor being P-MOS transistors each having a P-channel, the channels of said first transistor and said second transistor being connected in series, and the channels of said third transistor and said fourth transistor being connected in series, the N-channel of said first transistor and the P-channel of said third transistor being connected in parallel, and the N-channel of said second transistor and the P-channel of said fourth transistor being connected in parallel, the junction of the series connected channels of said first transistor and said second transistor, and the junction of the series connected channels of said third transistor and said fourth transistor being interconnected so as to form the output of said sender device.

26. A sender device according to claim 25, further comprising means for converting said electrical binary input signal into a first control signal and second control signal having complementary values, said first control signal controlling said first transistor and said fourth transistor, and said second control signal controlling said second transistor and said third transistor.

27. A sender device according to claim 25, wherein said N-MOS transistors are active in a first mode of operation, and said P-MOS transistors are active in a second mode of operation, and an output of impedance of said sender device is matched to a characteristic impedance of a transmission line connected to the output of said sender device, by making use of the inherent impedance of said N-MOS transistors in said first mode of operation and by making use of the inherent impedance of said P-MOS transistors in said second mode of operation.

28. A sender device according to claim 25, wherein bulk terminals of said first transistor and said second transistor are connected to a negative supply voltage.

29. A sender device according to claim 25, wherein bulk terminals of said third transistor and said fourth transistor are connected to a positive supply voltage.

30. A sender device according to claim 25, wherein said N-MOS transistors are active in a first mode of operation, and said P-MOS transistors are active in a second mode of operation, and bulk terminals are connected to said supply voltages via resistor networks for controlling an overlap of said operating modes.

31. A sender device according to claim 25, wherein said N-MOS transistors are active in a first mode of operation, and said P-MOS transistors are active in a second mode of operation, and bulk terminals are connected to programmable voltage references, whereby an overlap of said operating modes is dynamically controllable.

32. A sender device in accordance with claim 18, wherein a third output stage similar to said first output stage and comprising first and second N-MOS transistors is connected in parallel with the first output stage, and a fourth output stage similar to the second output stage and comprising third and fourth P-MOS transistors is connected in parallel with the second output stage so as to form a differential sender device.

33. A sender device in accordance with claim 32, wherein said third output stage is active in a first mode and said fourth output stage is active in a second mode, said third output stage when active in its first mode providing an output signal in said first range while simultaneously said fourth output stage is non-active, said fourth output stage when active in its second mode providing an output signal in said second range which simultaneously said third output stage is non-active.

34. A sender device in accordance with claim 32, wherein the channels of said first and second N-MOS transistors of said third output stage are connected in series, and the third and fourth P-MOS transistors of said fourth output stage are connected in series, the junction of the series connected channels of said first transistor and said second transistor of said third output stage, and the junction of the series connected channels of said third transistor and said fourth transistor of said fourth output stage being interconnected so as to form a further output of said sender device.

35. A sender device in accordance with claim 34, wherein a supply voltage is applied to drain and source electrodes, respectively, of said first and third transistors of said third and fourth output stages, said voltage being in either a low voltage range or in a high voltage range, thus forcing said third output stage to operate in its active first mode when the sender input signal is high and forcing said fourth output stage to operate in its active second mode when the sender input signal is low.

36. A sender device according to claim 32, wherein said third and fourth output stages are driven by supply voltages that are provided by an entity where said receiver device is located.

37. A sender device according to claim 32, wherein said third and fourth output stages are driven by supply voltages that are floating with respect to ground.

38. A sender device according to claim 32, wherein said third and fourth output stages are driven by supply voltages controlled from an entity where said receiver device is located, by setting a reference voltage to which a termination network is connected.

39. A sender device according to claim 32, wherein bulk terminals of said transistors are connected to supply voltages via resistor networks.

* * * * *